United States Patent [19]
Chiu

[11] Patent Number: 5,243,497
[45] Date of Patent: Sep. 7, 1993

[54] CHIP ON BOARD ASSEMBLY

[75] Inventor: Anthony M. Chiu, Richardson, Tex.

[73] Assignee: Texas Instruments, Dallas, Tex.

[21] Appl. No.: 953,634

[22] Filed: Sep. 29, 1992

[51] Int. Cl.⁵ .............................................. H05K 7/02
[52] U.S. Cl. ............................ 361/783; 174/261;
257/690; 361/764; 361/729; 361/748
[58] Field of Search ............... 361/392, 393, 395, 397,
361/400, 401, 403, 406, 410, 412, 408, 416;
174/261, 250; 257/690, 692, 700, 783, 784

[56] References Cited

U.S. PATENT DOCUMENTS

| | | | |
|---|---|---|---|
| 4,891,789 | 1/1990 | Quattrini et al. | 365/63 |
| 4,942,453 | 7/1990 | Ishida et al. | 457/68 |
| 5,185,502 | 2/1993 | Shepherd et al. | 174/262 |

Primary Examiner—Leo P. Picard
Assistant Examiner—Young S. Whang
Attorney, Agent, or Firm—Richard L. Donaldson; John Vandigriff; Stanton C. Braden

[57] ABSTRACT

A chip-on-board assembly and a method of making is described in which semiconductor chips having center contacts are mounted active side down on the circuit board, with the center contacts centered in an elongated opening in the circuit board. The center contacts are connected through the openings in the circuit board to contacts on the circuit board on the opposite side of the circuit board on which the semiconductor chip is mounted. Semiconductor chips are alternately mounted on opposite sides of the circuit board to provide a higher placement density of semiconductor chips.

12 Claims, 3 Drawing Sheets

CHIP ON BOARD ASSEMBLY

FIELD OF THE INVENTION

This invention relates to semiconductor devices, and more particularly to chip-on-board assembly and process wherein bare semiconductor chips are mounted alternately on opposite sides of a circuit board.

BACKGROUND OF THE INVENTION

In a chip-on-board assembly, semiconductor chips are usually mounted on one side of the circuit board. Gold wires are used to connect the bond pads on the semiconductor device to the contact areas on the circuit board. Large areas are required on the circuit board not only to mount the semiconductor chips, but also to provide the circuit contact areas for interconnections to connect to the semiconductor devices.

SUMMARY OF THE INVENTION

The invention is to a chip-on-board assembly in which bare semiconductor chips are alternately mounted on opposite sides of a circuit board. Each semiconductor device uses a center bond pad design. The bare chip is mounted active face down with the center bond pad centered within an opening in the circuit board. The center bond pads are ball or wedge bonded to circuit board contacts on the opposite side of the circuit board from that on which the bare chip is mounted. The alternate mounting and center bond pads of the semiconductor chip provides a higher utilization of circuit board area.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT

Figure 1:
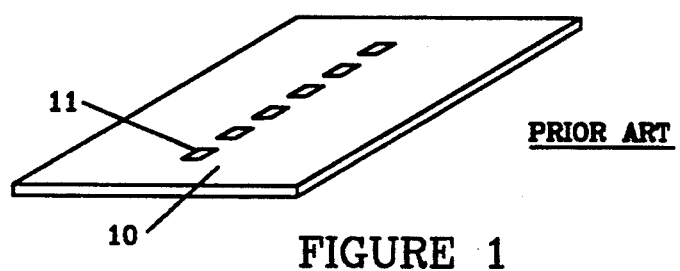
FIG. 1 is a prior art semiconductor having center bond pads.

FIG. 1 is a typical semiconductor chip 10 with center bond pads 11.

Figure 2:
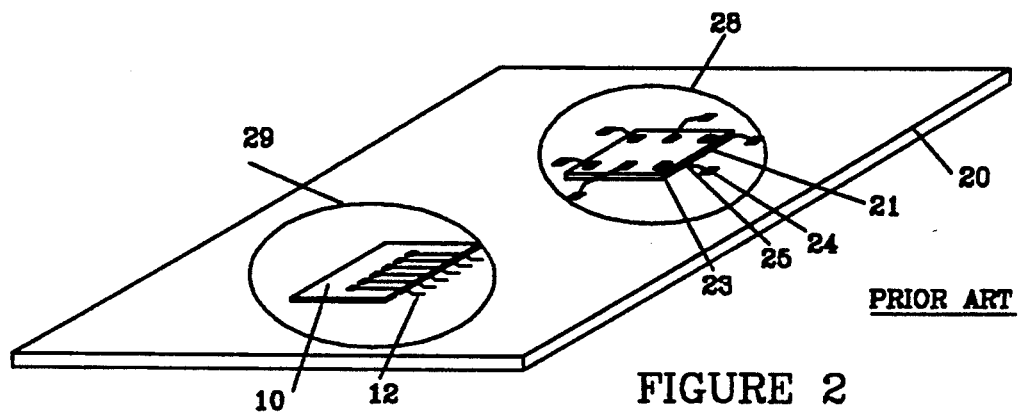
FIG. 2 is a typical prior art chip-on-board assembly.

FIG. 2 shows the typical assembly of a circuit board using chip-on-board process. When the bond pads 23 of the semiconductor device 21 are along the periphery of the chip, the area of circuit board 20 for 21 chip is typically larger than the chip due to the need to mount the chip and establish connections between the bond pads 23 on the chip and the contacts 24 on the circuit board. A chip 10 with center bond pads 11 can also be assembled in similar fashion with longer wire length 12. Each of chips 10 and 21 are coated with an encapsulating material at 28 and 29 respectively, to encapsulate and protected the device, and to hold the bond wire in place.

Figure 3:
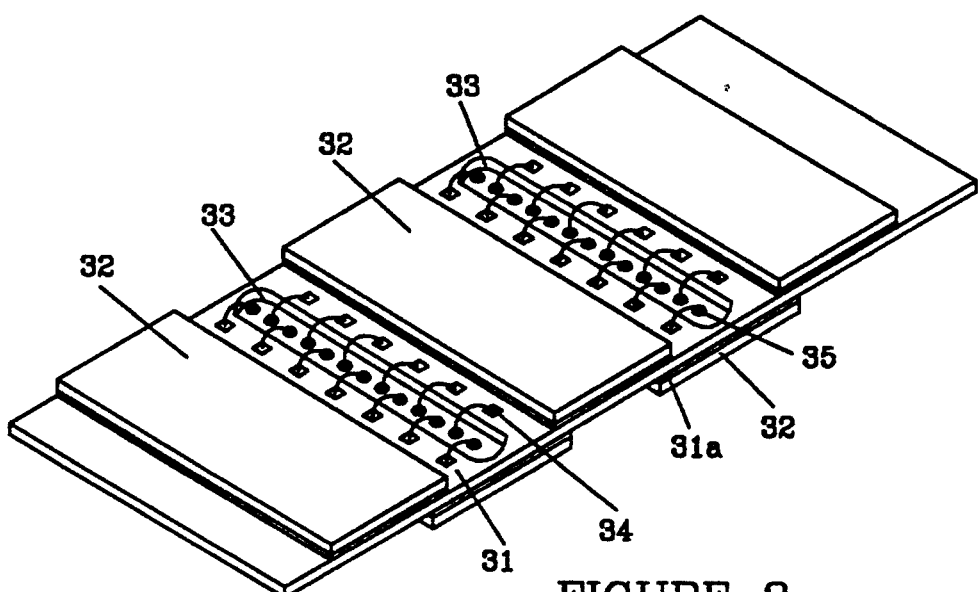
FIG. 3 illustrates a chip-on-board assembly according to the present invention.

FIG. 3 is an isometric view of the present invention. Only five chips are shown. Circuit board 31 has semiconductor chips 32 mounted alternately on opposite sides of circuit board 31. Each semiconductor chip 21 has center bond pads 35. Each chip is located over an opening 33 in circuit board 31 such that bond pads 35 are centered in openings 33. Each bond pad 35 is connected to a contact 34 on circuit board 31. Contacts 34 are a part of the circuitry on the circuit board 31. Vias are placed in some of these contacts to connect to other layers of the circuit board. Since bond pads 35 are close to the contacts 34, only a short bond wire is required to connect the semiconductor chip to the circuitry on the circuit board, and a larger number of semiconductor chips may be placed on each circuit board.

Figure 4:
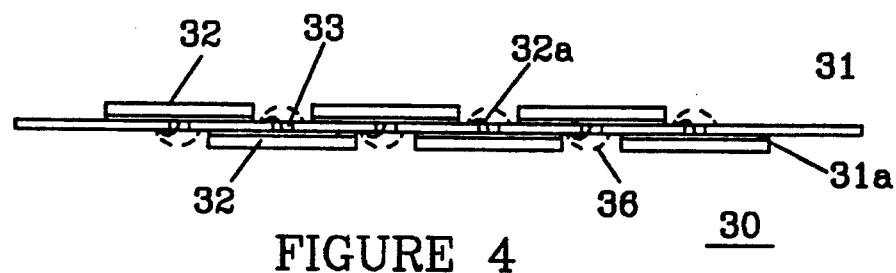
FIG. 4 is a side view of the chip-on-board assembly of the present invention.

FIG. 4 is a side view of a chip-on-board assembly. Bare semiconductor chips 32 are attached by a high temperature adhesive 31a alternately on opposite sides of circuit board 31. Board 31 has been coated with a solder mask for electrical isolation. Each chip has a center bond pad arrangement. An array of bond pads, 35, are located away from the edge of the chip. This array of pads is centered over an opening 33 in circuit board 31. Each bond pad on semiconductor 32 is ball or wedge bonded with a bond wire 32a to a respective contact 34 (not shown) on the opposite side of circuit board 31 to which the semiconductor chip is attached. By alternating the mounting of the semiconductor chips on opposite sides of the circuit board, and by using a center bond pad array, the chips may be mounted closer together, providing a higher density of devices. A protective coating 36 is applied after testing.

Figure 5:
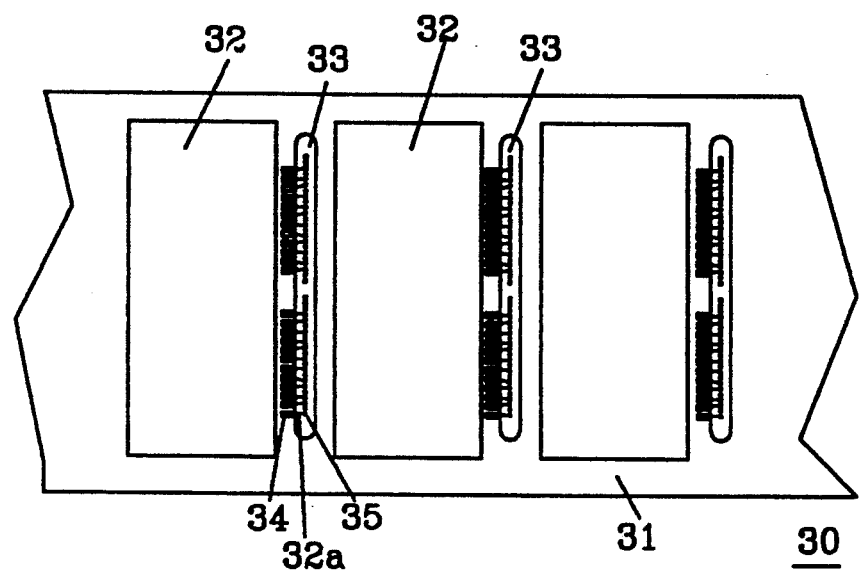
FIG. 5 is a top view of the chip-on-board assembly of the present invention.

FIG. 5 is a top view of chip-on-board assembly 30. Semiconductor chips 32 are mounted close together with an opening 33 in the circuit board between each pair of semiconductor chips. The semiconductor chip 32 on the bottom side of Circuit board 31, as viewed in FIG. 4, has its center array of bond pads centered over an opening 33 and the bond pads 35 are connected to contact areas 34 on the top side of circuit board 31. Bond wires 32a extend from the bond pads, through opening 33 and are connected to contacts 34 on the opposite side of circuit board 31. A single row of contacts on circuit board 31 is shown between each pair of semiconductor chips, but a double row of contacts may be used depending on the desired circuit configuration.

The bonding of the semiconductor bond pads through the circuit board to contacts on the opposite side of the circuit board make possible the shortest bond wire for connecting semiconductor chip to the circuit board. The short bond wires do not extend above the semiconductor chip, providing protection for the bond wires during testing, and provides a low profile, high chip placement density for the overall board assembly.

Only one row of semiconductor chips alternately mounted on a circuit board are shown, but two of more rows may be mounted as desired for a particular circuit configuration.

What is claimed is:

1. A Chip-on-board semiconductor assembly including semiconductor chips have at least one active surface and a circuit board having two mounting surfaces, comprising:

a circuit board having a plurality of openings extending transverse to the length of the circuit board;

a plurality of circuit contacts on each of the two mounting surfaces of said circuit board;

a plurality of semiconductor chips alternately mounted on opposite sides of said circuit board with the active surface attached to the surface of the circuit board, each semiconductor chip having a center array of bond pads on the active face, the center array of bond pads on each semiconductor chip centered over one of the plurality of openings in the circuit board; and bond wires connected to the center array of bond pads on each semiconductor chip extending through an opening in the circuit board and bonded to circuit contacts on the side of the circuit board opposite from that on which the semiconductor chip is attached.

2. The semiconductor assembly according to claim 1, in which the bond wires are ball bonded to the bond pads on the semiconductor chip.

3. The semiconductor assembly according to claim 1, in which the bond wires are wedge bonded to the bond pads on the semiconductor chip.

4. The semiconductor assembly according to claim 1, including at least two rows of alternately mounted semiconductor chips on each side of the circuit board.

5. The semiconductor assembly according to claim 1, wherein each semiconductor chip has its active face attached to the circuit board with an adhesive before wire bonding.

6. A chip-on-board semiconductor assembly including semiconductor chips have at least one active surface and a circuit board having two mounting surfaces, comprising:

a circuit board having a plurality of openings extending transverse to the length of the circuit board;

a plurality of circuit contacts on each of the two mounting surfaces of said circuit board;

a plurality of semiconductor chips alternately mounted on opposite sides of said circuit board with the active surface attached to the surface of the circuit board with an adhesive, each semiconductor chip having a center array of bond pads on the active face, the center array of bond pads on each semiconductor chip centered over one of the plurality of openings in the circuit board; and bond wires connected to the center array of bond pads on each semiconductor chip extending through an opening in the circuit board and bonded to circuit contacts on the side of the circuit board opposite from that on which the semiconductor chip is attached.

7. The semiconductor assembly according to claim 6, in which the bond wires are wedge bonded to the bond pads on the semiconductor chip.

8. The semiconductor assembly according to claim 6, including at least two rows of alternately mounted semiconductor chips on each circuit board.

9. The semiconductor assembly according to claim 6, wherein each semiconductor chip has its active face attached to the circuit board with an adhesive before wire bonding.

10. A method for making a chip-on-board assembly, comprising the steps of:

preparing a circuit board having first and second sides, each of said first and second sides having conductive circuitry and contacts thereon;

forming plurality of elongated holes extending completely through said circuit board;

mounting a plurality of semiconductor chips having center contacts on one face on said first and second sides of said circuit board such that the center contacts of one of said plurality of semiconductor chip are centered in one of said elongated holes; and connecting each of said center contacts on said semiconductor chips to a contact on said circuit board with a bond wire that is attached to a center contact, extends through the elongated hole and connects to a circuit board contact on a side of the circuit board opposite from the side on which the semiconductor chip is mounted.

11. The method according to claim 10, including the step of attaching the semiconductor chips to the circuit board with an adhesive.

12. The method according to claim 10, wherein said plurality of elongated holes extending through said circuit board are parallel to each other.

* * * * *